United States Patent
Yamamoto et al.

(10) Patent No.: US 8,109,185 B2
(45) Date of Patent: Feb. 7, 2012

(54) METHOD FOR CUTTING PROTECTIVE TAPE OF SEMICONDUCTOR WAFER AND PROTECTIVE TAPE CUTTING DEVICE

(75) Inventors: Masayuki Yamamoto, Ibaraki (JP); Yukitoshi Hase, Kameyama (JP); Yasuji Kaneshima, Kameyama (JP)

(73) Assignee: Nitto Denko Corporation, Osaka (JP)

( * ) Notice: Subject to any disclaimer, the term of this patent is extended or adjusted under 35 U.S.C. 154(b) by 531 days.

(21) Appl. No.: 12/272,586

(22) Filed: Nov. 17, 2008

(65) Prior Publication Data

US 2009/0133551 A1 May 28, 2009

(30) Foreign Application Priority Data

Nov. 26, 2007 (JP) .................................. 2007-304524

(51) Int. Cl.
*B32B 38/04* (2006.01)

(52) U.S. Cl. ......... 83/34; 83/52; 83/74; 83/370; 83/922; 156/523

(58) Field of Classification Search ................ 83/28, 33, 83/34, 39, 48, 49, 52, 73, 74, 212, 365, 368, 83/370, 563, 582, 922, 955; 438/115; 156/250, 156/353, 522, 523, 525, 526
See application file for complete search history.

(56) References Cited

U.S. PATENT DOCUMENTS

| 4,603,609 | A | * | 8/1986 | Takatoshi ........................ 82/51 |
| 6,102,023 | A | * | 8/2000 | Ishiwata et al. ............. 125/13.01 |
| 7,357,165 | B2 | * | 4/2008 | Yamamoto .................... 156/353 |
| 7,516,768 | B2 | * | 4/2009 | Yamamoto et al. ........... 156/510 |
| 2003/0209117 | A1 | * | 11/2003 | Peng ................................ 83/13 |
| 2005/0081692 | A1 | * | 4/2005 | Mosiewicz et al. .......... 83/508.3 |

FOREIGN PATENT DOCUMENTS

| JP | 10-209251 | * | 8/1998 |
| JP | 2006-015453 | A | 1/2006 |

OTHER PUBLICATIONS

The First Office Action for the Application No. 200810179034.6 from The State Intellectual Property Office of People's Republic of China dated Jun. 22, 2011.

* cited by examiner

*Primary Examiner* — Edward Landrum
(74) *Attorney, Agent, or Firm* — Cheng Law Group, PLLC

(57) ABSTRACT

A cutter blade is cut-in by being moved towards a deep part of a notch from one open end of the notch while being moved in a forward direction with respect to an outer periphery of a wafer. Immediately before a blade edge reaches the deep part of the notch, cutting movement of the cutter blade is once stopped, reversely moved to a initial piercing position, and thereafter, the cutter blade is moved towards the deep part of the notch from the other open end of the notch while being moved in a reverse direction with respect to the outer periphery of the wafer.

7 Claims, 9 Drawing Sheets

(a)

(b)

(c)

METHOD FOR CUTTING PROTECTIVE TAPE OF SEMICONDUCTOR WAFER AND PROTECTIVE TAPE CUTTING DEVICE

BACKGROUND OF THE INVENTION (1) Field of the Invention

The present invention relates to a method for cutting a protective tape of a semiconductor wafer and a protective tape cutting device for relatively moving a cutter blade with respect to the semiconductor wafer along an outer periphery of the semiconductor wafer to cut out the protective tape joined to a surface of the semiconductor wafer.

(2) Description of the Related Art

In the above protective tape cutting method, the cutter blade is relatively moved along the outer periphery of the semiconductor wafer having a positioning notch on the outer periphery. In this case, the tape on a V-shaped notch portion is cut in the following manner. When the cutter blade passes through a first part of the notch, a blade edge thereof is rotated so as to be directed towards a center of the wafer. When the cutter blade passes through a latter part of the notch, the blade edge is rotated so as to be directed towards the outer periphery of the wafer (see Japanese Laid-Open Patent Publication No. 2006-15453).

According to the protective tape cutting method described above, the protective tape is not greatly exposed to remain in an interior of the notch, and thus it is effective in suppressing attachment of dust in comparison with a case where the remaining protective tape exists in the notch. However, the cutter blade reaches a deep part of the notch while cutting the tape along an oblique side in the first part, and the tape is set in the latter part such that a cut-in angle of the blade edge of the cutter blade is set substantially perpendicular to an inner edge of the notch. Therefore, there arise problems such as the blade edge cutting into the inner edge of the notch to damage the semiconductor wafer or the blade edge being worn at an earlier time. In particular, the recent thinned semiconductor wafer with less rigidity tends to be more easily damaged at the portion formed with the notch due to the cutter blade being in contact with or sticking in the wafer.

SUMMARY OF THE INVENTION

It is a main object of the present invention to provide, in a protective tape cutting process of a semiconductor wafer formed with a notch, a method for cutting a protective tape of the semiconductor wafer and a protective tape cutting device, capable of cutting the protective tape along a shape of the notch while suppressing damages to the semiconductor wafer and wear of the blade edge at an earlier time.

In order to achieve the above object, the invention employs the following configuration.

A protective tape cutting method for a semiconductor wafer, for relatively moving a cutter blade along an outer periphery of the semiconductor wafer formed with a positioning notch to cut out a protective tape joined to a surface of the semiconductor wafer along an outer shape of the wafer, wherein in the step of cutting the protective tape at a notch portion of the semiconductor wafer, the protective tape is cut while laying a side surface of the cutter blade along an oblique side towards a deep part of the notch from an open end.

According to the protective tape cutting method for the semiconductor wafer of the present invention, the side surface of the cutter blade cuts the protective tape along the oblique side towards the back from the open end of the notch portion, so that the blade edge does not form an acute angle with respect to the oblique side. Therefore, the blade edge is neither in contact with nor sticks the oblique side, and thus does not damage the thinned semiconductor wafer or wear the blade edge at an earlier time.

The protective tape is preferably cut in the following manner in the above-described method.

For instance, the cutter blade is moved towards the deep part of the notch from one open end of the notch while being moved in a constant direction with respect to the outer periphery of the semiconductor wafer; the cut-in cutter blade is once removed from the notch; and the cutter blade, which is once removed from the notch and retreated to a initial piercing position, is moved towards the deep part of the notch from the other open end of the notch while being moved in a reverse direction with respect to the outer periphery of the semiconductor wafer.

According to the method, the cutter blade is initially pierced to the protective tape at a predetermined position on the outer periphery of the wafer, and is moved in the forward direction with respect to the outer periphery of the wafer at a predetermined inclined attitude having a small cut-in angle with respect to the outer periphery of the wafer.

When the cutter blade reaches the notch, the cutter blade enters the deep part of the notch from the one open end of the notch, and cuts into the protective tape while laying the side surface along the oblique side. The cutter blade is once removed from the notch when the cutter blade reaches the vicinity of a deepest part of the notch.

The cutter blade removed from the notch is switched to an attitude having a small cut-in angle with respect to the outer periphery of the wafer in movement in a reverse direction with respect to the outer periphery of the wafer. The cutter blade again pierces the protective tape in the vicinity of the initial cutting start position, and cuts the protective tape along the outer periphery of the wafer while moving in the reverse direction with respect to the outer periphery of the wafer.

When the cutter blade reaches the notch, the cutter blade enters the deep part of the notch from the other open end of the notch and cuts into the protective tape with the side surface lying along the oblique side, and the protective tape is completely cut along the shape of the notch by connecting the cut-in with the cut into the tape in the first part. That is, the method of the above invention can be suitably performed.

As another example, a double-edged cutter blade is moved towards the deep part of the notch from one open end of the notch while being moved in one direction with respect to the outer periphery of the semiconductor wafer; the cutter blade is retreated to a cutting start position along a cut outward path from a front of the deep part of the notch; and a cut-in angle of the cutter blade is changed from the initial position, the protective tape is cut by moving the cutter blade in a reverse direction with respect to the outer periphery of the semiconductor wafer, and the cutter blade is moved towards the deep part of the notch from the other open end of the notch.

According to the method, one edge of the cutter blade is used in the first part cutting step of at the notch, and the other edge of the cutter blade is used in the latter part cut-in step. In this case, for example, when the cut-in angle of the cutter blade with respect to the outer periphery of the wafer is 30°, an angle for switching for the attitude of the cutter blade when transitioning from the first part cut-in step to the latter part-cut-in step only needs to be a rotation movement by 60°. That is, the other blade edge faces toward the tangent direction of the outer periphery of the wafer by rotation of 60°. For instance, the cutter blade needs to be rotated by 120° in order to switch the attitude at the cut-in angle of 30° similarly to the above by using a single-edged cutter blade.

In the case of the double-edged cutter blade, the blade edge does not need to be completely removed from the protective tape in switching the attitude of the cutter blade. That is, the attitude of the cutter blade can be switched while cutting the protective tape by removing the blade edge opposite to the open end and rotating the attitude by 60°.

In the above method, the protective tape is preferably cut after acquiring positional information on the notch in advance, and a cut state of the deep part of the notch after cutting the protective tape is acquired. More preferably, the protective tape at the notch portion is cut again in a case where cut sites are not connected at the deep part of the notch in accordance with the acquired information.

According to the method, precision of the alignment for cutting the protective tape at the notch portion can be enhanced, presence of a cutting defect of the protective at the deepest part of the notch can be accurately checked, and thereby the cutting defect of the protective tape can be avoided.

In order to achieve the above object, the present invention employs the following configuration.

A protective tape cutting device for a semiconductor wafer, for relatively moving a cutter blade along an outer periphery of the semiconductor wafer formed with a positioning notch to cut out a protective tape joined to a surface of the semiconductor wafer along an outer shape of the wafer, the device including: cutter blade moving means for moving the cutter blade relatively in a forward direction and in a reverse direction with respect to the outer periphery of the semiconductor wafer; attitude switching means for switching in the forward or the reverse direction a cut-in attitude of the cutter blade with respect to the outer periphery of the semiconductor wafer; and a control device for controlling switch of the cut-in attitude in the forward or the revere direction by operating the attitude switching means so as to lay a side surface of the cutter blade along an oblique side towards a deep part of the notch from an open end of the notch in the step of cutting a notch portion of the semiconductor wafer.

The method of the present invention described above can be suitably realized with the protective tape cutting device of the present invention.

In this configuration, it is preferable to further include optical means for acquiring positional information on the notch before cutting the protective tape and acquiring a cut state of the deep part of the notch after cutting the protective tape, wherein the control device is configured to control movement of the cutter blade based on the positional information acquired by the optical means.

BRIEF DESCRIPTION OF THE DRAWINGS

For the purpose of illustrating the invention, there are shown in the drawings several forms which are presently preferred, it being understood, however, that the invention is not limited to the precise arrangement and instrumentalities shown.

DETAILED DESCRIPTION OF THE PREFERRED EMBODIMENTS

Embodiments of the present invention will now be described with reference to the drawings.

Figure 1:
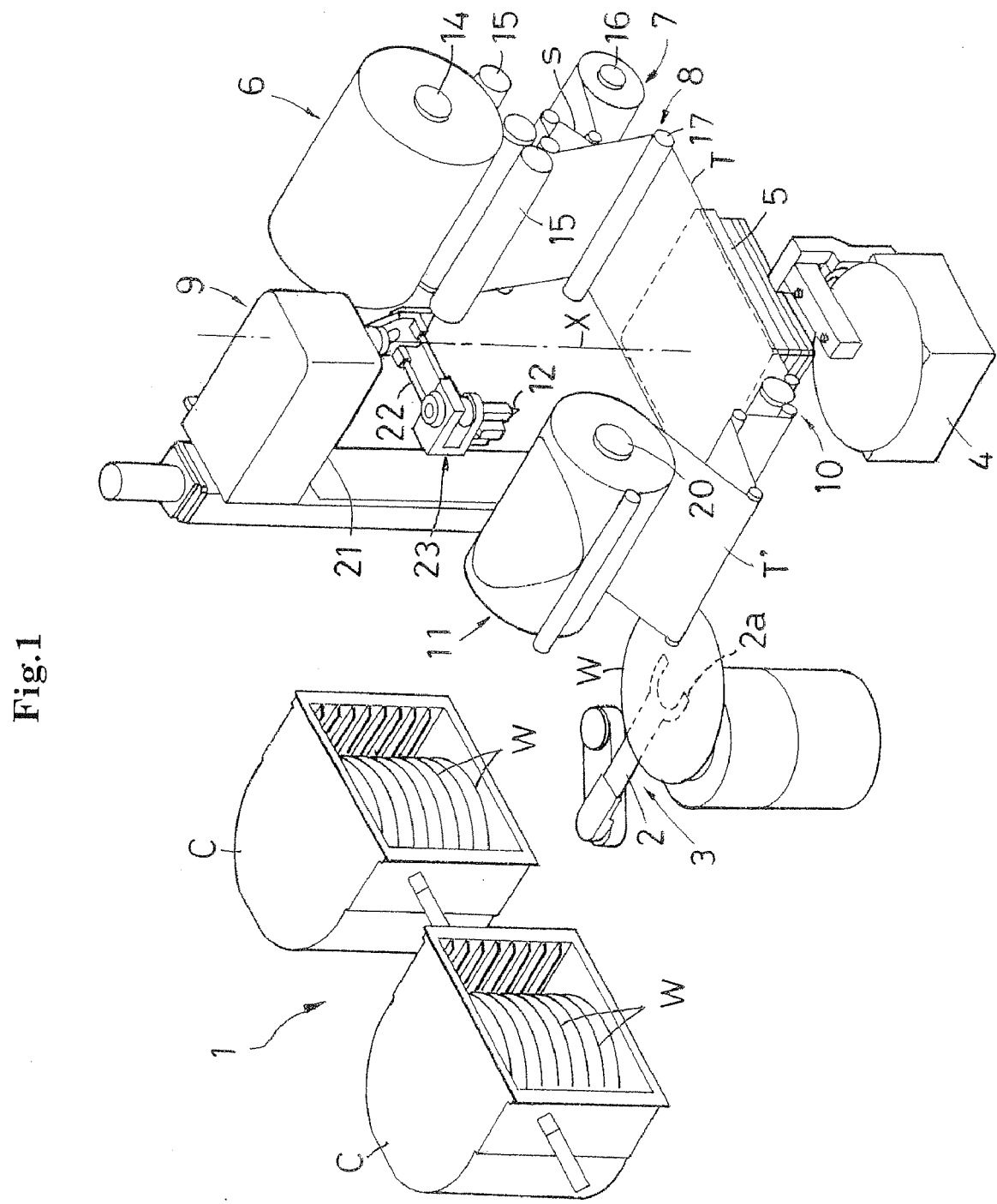
FIG. 1 is a perspective view showing an entire protective tape joining apparatus.

FIG. 1 is a perspective view showing an entire configuration of a protective tape joining apparatus.

The protective tape joining apparatus includes a wafer supplying/collecting part 1 filled with a cassette C accommodating a semiconductor wafer (hereinafter abbreviated as simply "wafer") W; a wafer transport mechanism 3 equipped with a robot arm 2; an alignment stage 4; a chuck table 5 for mounting and suction-holding the wafer W; a tape supply part 6 for supplying a protective tape T for protecting a surface toward the wafer W; a separator collecting part 7 for separating and collecting a separator s from the protective tape T provided with the separator supplied from the tape supply part 6; a joining unit 8 for joining the protective tape T to the wafer W mounted and suction-held on the chuck table 5; a protective tape cutting device 9 for cutting out the protective tape T joined to the wafer W along an outer shape of the wafer W; a separation unit 10 for separating an unnecessary tape T' after being joined to the wafer W and cut off; a tape collecting part 11 for winding up and collecting the unnecessary tape T' separated by the separation unit 10; and the like. A specific configuration of each structural part and mechanism will be described below.

The wafer supplying/collecting part 1 is arranged with two cassettes C in parallel. In each cassette C, a great number of wafers W are inserted and accommodated in a plurality of stages in a horizontal attitude with wiring pattern surfaces (front surfaces) facing upward.

The robot arm 2 included in the wafer transport mechanism 3 is configured to be horizontally movable forward and backward, and can be entirely rotated as well as lifted. A wafer holder 2*a* having a horseshoe shape and suctioning by vacuum is arranged at a distal end of the robot arm 2. The wafer holder 2*a* suction-holds the wafer W from a back surface by being inserted into a gap between the wafers W accommodated in the plurality of stages in the cassette C, pulls out the suction-held wafer W from the cassette C, and transports this wafer W to, in the order of the alignment stage 4, the chuck table 5, and the wafer supplying/collecting part 1.

The alignment stage 4 aligns the wafer W transported and mounted by the wafer transport mechanism 3 in accordance with the notch formed on the outer periphery of the wafer W.

Figure 6:
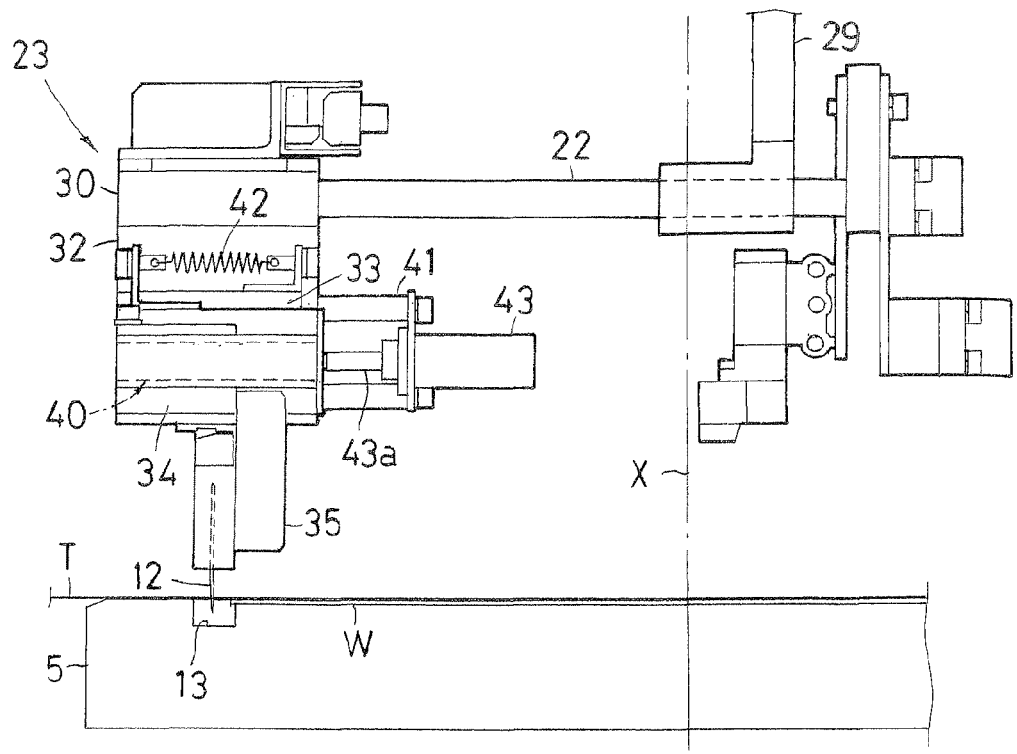
FIG. 6 is a side view showing main parts in a case where a cutter blade is pierced into the protective tape.

The chuck table 5 suctions by vacuum the wafer W moved from the wafer transport mechanism 3 and mounted in a predetermined alignment attitude. A cutter running mechanism 13, shown in FIG. 6, is formed on an upper surface of the chuck table 5, to rotate a cutter blade 12 included in the protective tape cutting device 9, which is to be described later, along the outer shape of the wafer W and cut the protective tape T.

The tape supply part 6 is configured to wind and guide the protective tape T with a separator fed out from a supply bobbin 14 to a guide roller 15 group, and lead the protective tape T separated from the separator s to the joining unit 8. The supply bobbin 14 is configured such that an appropriate rotational resistance is applied and the tape is not excessively fed.

The separator collecting part 7 is configured such that a collecting bobbin 16 which winds up the separator s separated from the protective tape T is rotatably driven in a wind-up direction.

Figure 8:
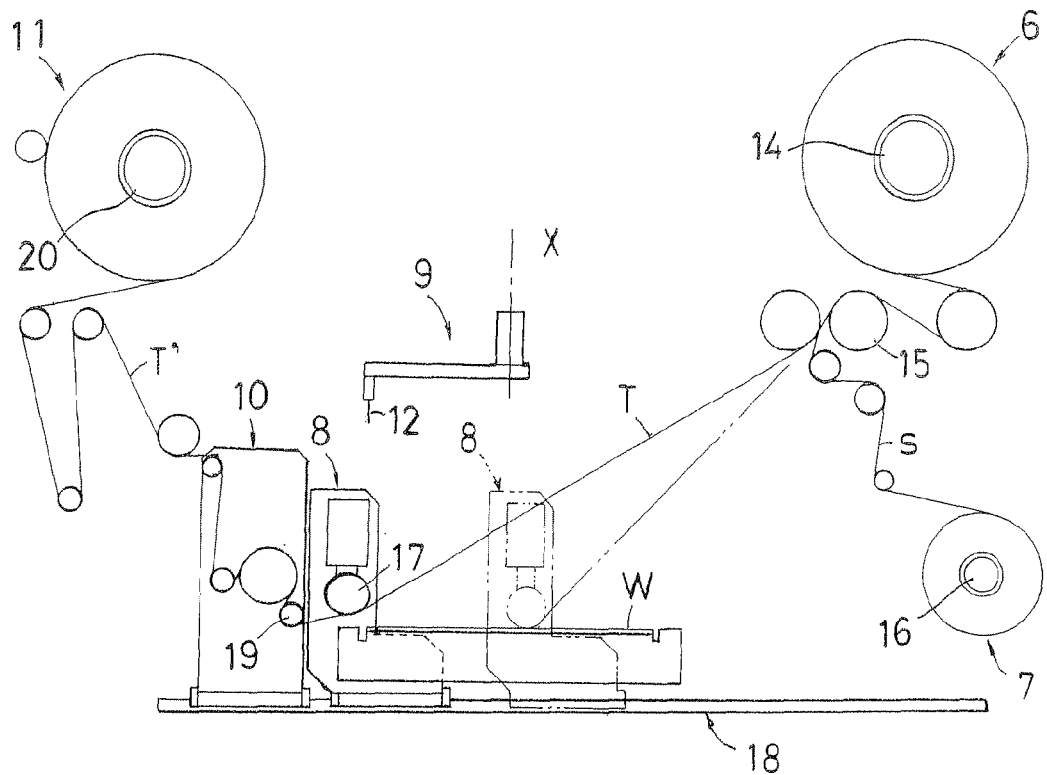
FIGS. 8 to 11 are front views each showing a protective tape joining process.

The joining unit 8 includes a joining roller 17 arranged forward and horizontally, and is configured to be reciprocatingly driven in the horizontal direction to left and right by a slide guiding mechanism 18 shown in FIG. 8 and a screw-feeding drive mechanism (not shown).

The separation unit 10 includes a separation roller 19 forward and horizontally, and is configured to be reciprocatingly driven in the horizontal direction to left and right by the slide guiding mechanism 18 and a screw-feeding drive mechanism (not shown).

Returning to FIG. 1, the tape collecting part 11 is configured such that a collecting bobbin 20 which winds up the unnecessary tape T' is rotatably driven in a wind-up direction.

A tape cutting mechanism 9 includes a pair of supporting arms 22 arranged in parallel with each other and rotatable about a vertical axis X positioned on a center of the chuck table 5 under a movable table 21 which is liftably driven. A cutter unit 23 is arranged at a free end of the supporting arm 22. The cutter unit 23 is attached with the cutter blade 12 with the blade edge facing downward. That is, when the supporting arm 22 rotates about the vertical axis X, the cutter blade 12 moves along the outer periphery of the wafer W and cuts out the protective tape T. The detailed structure thereof is shown in FIGS. 2 to 6.

The movable table 21 is fed by screwing and lifted along a vertical rail 25 by forward-reverse rotating of a motor 24. A turning shaft 26 arranged turnably about the vertical axis X at the free end of the movable table 21 is coupled to a motor 27 arranged on the movable table 21 by way of two belts 28. That is, the turning shaft 26 is turned in a predetermined direction by operation of the motor 27.

The supporting arm 22 passes through a lower end of a supporting member 29 extended downward from the turning shaft 26 and is supported so as to be adjustable to slide in the horizontal direction. That is, the distance from the vertical axis X, which is the center of rotation, of the cutter blade 12 is adjusted by the slide adjustment of the supporting arm 22. In other words, a rotation radius of the cutter blade 12 can be changed and adjusted in correspondence with a wafer diameter.

Figure 3:
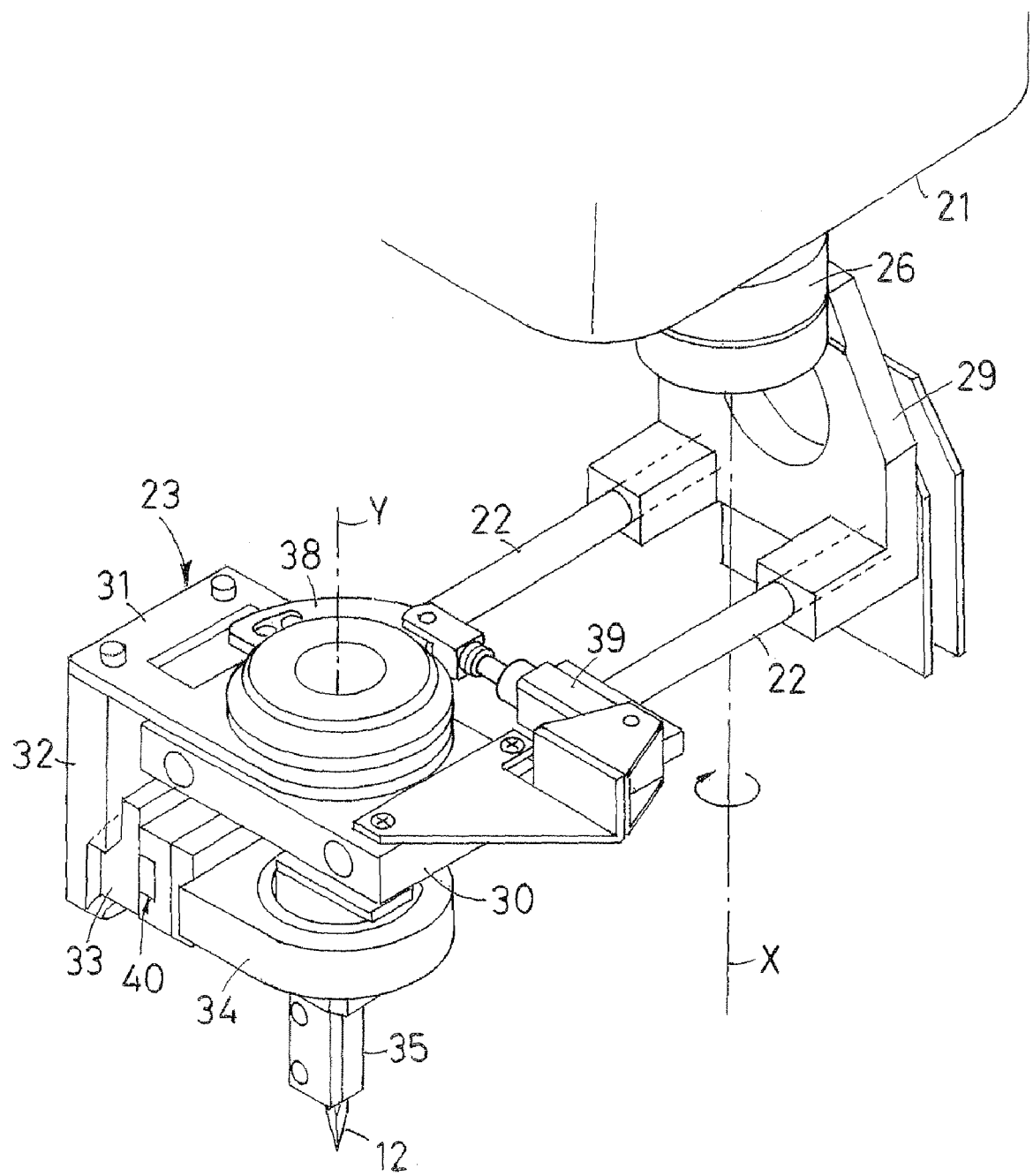
FIG. 3 is a perspective view showing main parts of the protective tape cutting device.
Figure 4:
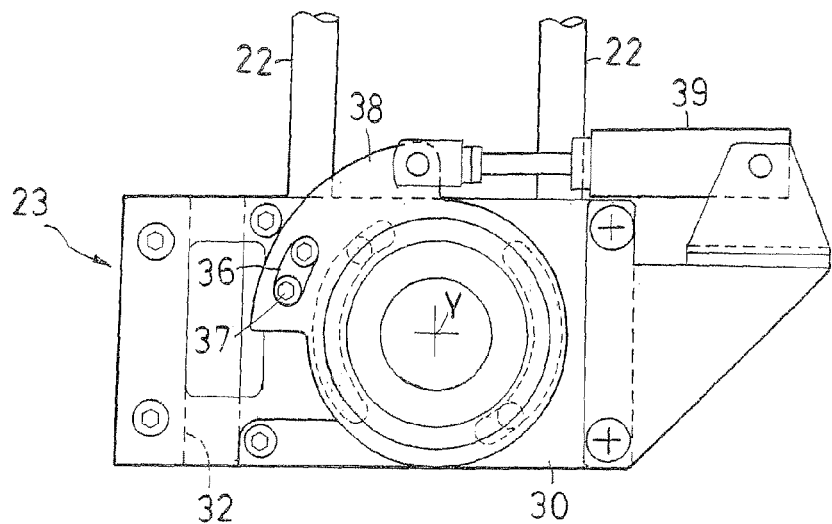
FIG. 4 is a plan view of a cutter unit.
Figure 5:
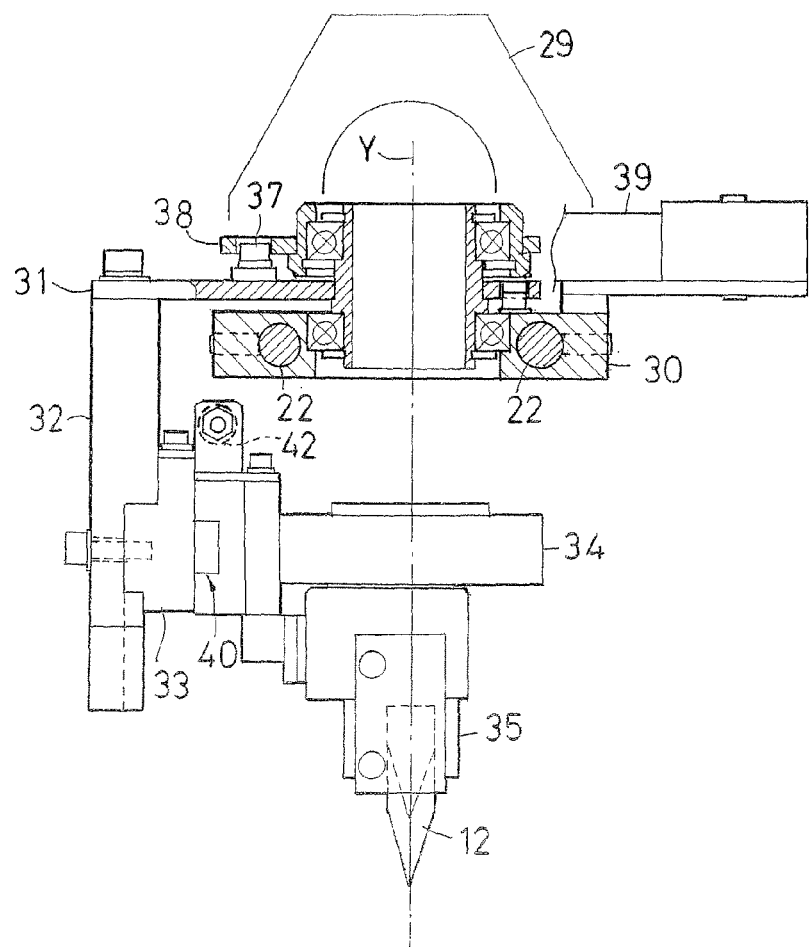
FIG. 5 is a front view of the cutter unit a part of which is longitudinally cut.

As shown in FIGS. 3 and 4, a bracket 30 is securely attached to the free ends of the supporting arms 22. The cutter unit 23 is attached to and supported by the bracket 30. The cutter unit 23 is configured by a turning member 31 turnably supported by the bracket 30 within a predetermined range about a vertical axis Y, a supporting bracket 32 in a vertical wall shape coupled to a lower surface of an end of the turning member 31, a cutter supporting member 33 coupled to a side surface of the supporting bracket 32, a bracket 34 supported by the cutter supporting member 33, a cutter holder 35 attached to the bracket 34, and the like. The cutter blade 12 is replaceably fastened to a side surface of the cutter holder 35.

As shown in FIG. 4, an operation flange 38 which integrally turns with the turning member 31 by engagement between a long hole 36 and a projection 37 is arranged above the turning member 31. The attitude about the vertical supporting point Y of the entire cutter unit 23 with respect to the supporting arm 22 is changed, and an angle (cut-in angle) of the cutter blade 12 with respect to a movement direction is adjusted within a predetermined range, by turning the operation flange 38 with an air cylinder 39.

With respect to the cutter supporting member 33, the bracket 34 is supported in a linearly slidable manner in a longitudinal direction (front and back direction of the plane of drawing in FIG. 5) of the supporting arm 22 by way of a guide rail mechanism 40. A spring 42 is arranged across the cutter supporting member 33 and the bracket 34. The bracket 34 is slidingly biased in a direction of approaching to the vertical axis (center of rotation) X by an spring restoration force of the spring 42.

As shown in FIG. 6, an air cylinder 43 in an attitude along the sliding direction of the bracket 34 is fixed and arranged by way of a stator 41 on the rotation center side of the cutter supporting member 33, and a piston rod 43a of the air cylinder 43 is arranged so as to be in contact with an end face of the bracket 34.

Figure 2:
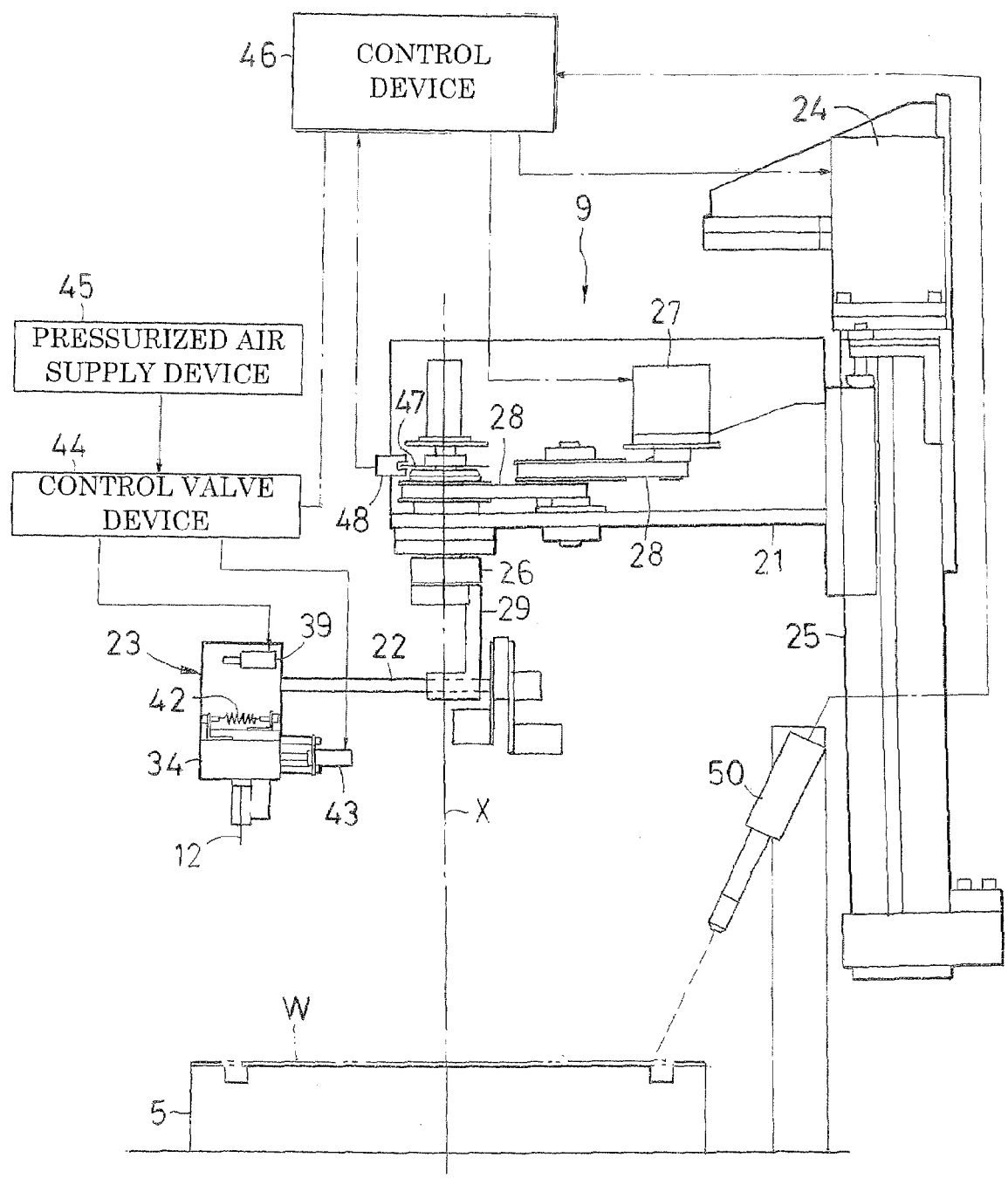
FIG. 2 is a side view showing an entire protective tape cutting device.

As shown in FIG. 2, the air cylinders 39, 43 are connected to a pressured air supply device 45 by way of a control valve device 44 for switching air pressure and an air supply direction by electrical control. The control valve device 44 is connected to a control device 46 which is controlled by a computer. A disk 47 having notches and holes formed at equal pitches on an outer peripheral part is securely fixed on the upper side of turning shaft 26, and an electromagnetic or photoelectric pulse sensor 48 is arranged to face the outer peripheral part of the disk 47.

In other words, a pulse signal corresponding to turning of the disk 47 is output from the pulse sensor 48. The signal from the pulse sensor 48 is input to the control device 46, and the position of the cutter blade 12 is calculated by counting the pulses. Furthermore, a monitoring camera 50 directed towards the edge of the wafer W is arranged above the side of the chuck table 5. Imaged information from the monitoring camera 50 is transmitted to the control device 46. The control device 46 acquires positional information on the notch by analyzing the image, and acquires information on the cut state (cutting defect, etc.) of the protective tape at the notch portion after the protective tape is cut.

A series of basic operations for joining the protective tape T to the front surface of the wafer W using the device according to the above embodiment will be described with reference to FIGS. 6 to 9.

When a joining command is issued, the robot arm 2 of the wafer transport mechanism 3 is first moved towards the cassette C which is mounted and loaded on the cassette table. The robot arm 2 inserts the wafer holder 2a into a gap between the wafers accommodated in the cassette C, suction-holds and transports the wafer W from the back surface (lower surface) with the wafer holder 2a, and places the wafer W taken out on the alignment stage 4.

The wafer W mounted on the alignment stage 4 is aligned using a notch n formed on the outer periphery of the wafer W. The aligned wafer W is again transported by the robot arm 2, and mounted on the chuck table 5.

The wafer W mounted on the chuck table 5 is rotated, and is suction-held in a state where the center thereof is aligned on the center of the chuck table 5. The notch formed on the wafer W is imaged by the monitoring camera 50 in this rotation step. The positional information on the notch is acquired from an acquired image, an imaged position, and a rotation angle detected during rotation. As shown in FIG. 8, the joining unit 8 and the separation unit 10 are at the initial positions on the left side. The cutter blade 12 of the tape cutting mechanism 9 is standby at the initial position thereabove.

As shown with a virtual line in FIG. 8, the joining roller 17 of the joining unit 8 is lifted down, and rolled towards the front side (right direction in FIG. 8) on the wafer W while pressing the protective tape T downward with the joining roller 17. The protective tape T is thereby joined to the entire front surface of the wafer W.

Figure 9:
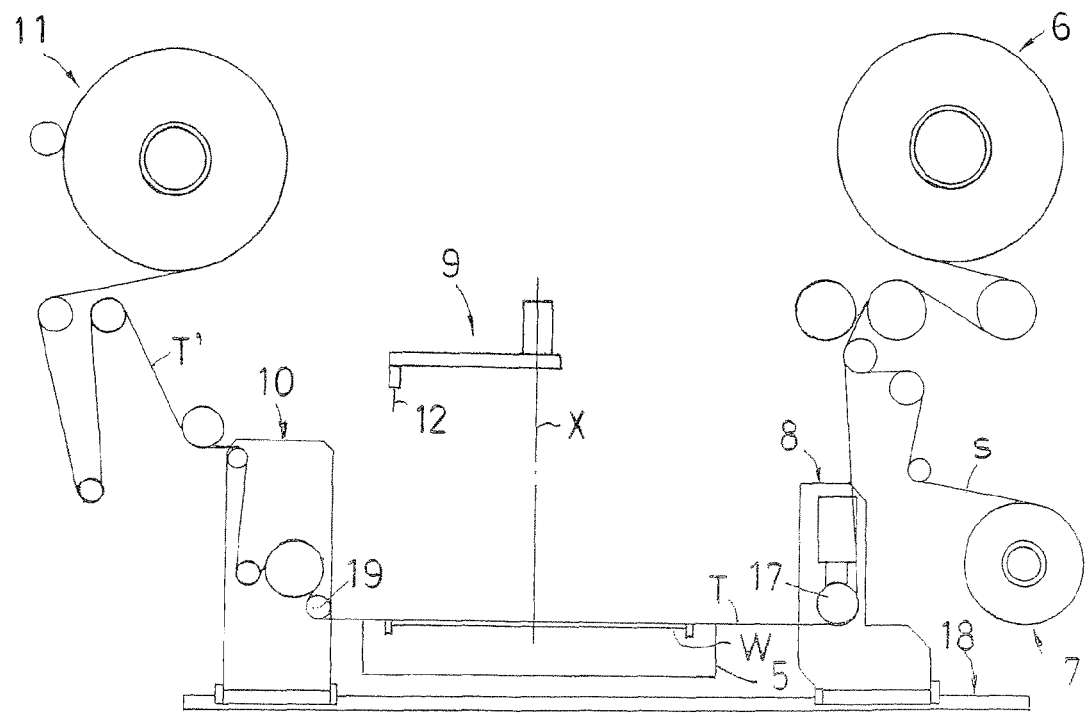

As shown in FIG. 9, when the joining unit 8 reaches an end position, the cutter blade 12 in standby thereabove is lifted down, and is pierced through the protective tape T in a cutter running groove 13 of the chuck table 5.

Figure 7:
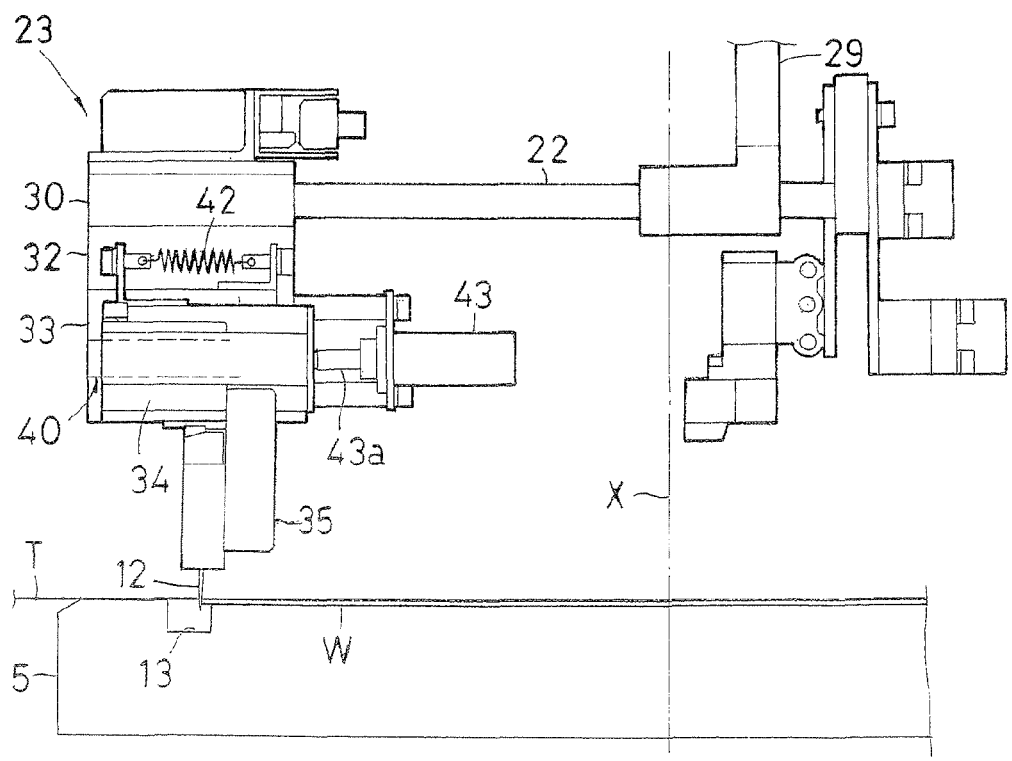
FIG. 7 is a side view showing main parts in a state where the cutter blade is brought into contact with an outer peripheral edge of the wafer.

In this case, as shown in FIG. 6, high pressure air is supplied to the air cylinder 43 and the piston rod 43 is projected, whereby the bracket 34 slidably moves to the outer stroke end against the spring 42. Therefore, the cutter blade 12 is pierced through the protective tape T at the position slightly (a few millimeters) outwardly spaced apart from the outer peripheral edge of the wafer W. Thereafter, the air pressure of the air cylinder 43 is reduced so that the projection force of the piston rod 43 becomes smaller than the spring force. As shown in FIG. 7, the bracket 34 is slidably moved towards the wafer center side with the pushing bias force of the spring 42, and the blade edge of the cutter blade 12 is brought in contact with the outer peripheral edge of the wafer W.

Figure 10:
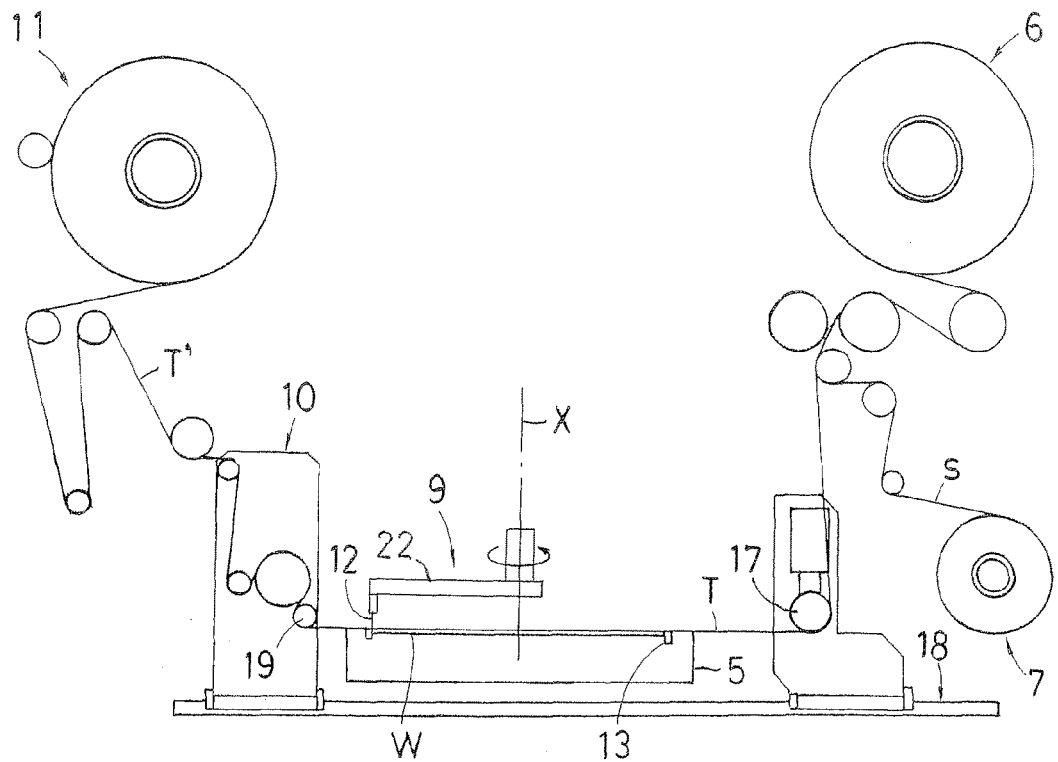

The supporting arm 22 is rotated when the pushing and setting of the cuter blade 12 to the outer peripheral edge of the wafer is completed at the cutting start position of the cutter blade 12, as shown in FIG. 10. Accompanied therewith, the cutter blade 12 is rotatably moved while being in slidable contact with the outer peripheral edge of the wafer, and the protective tape T is cut along the outer periphery of the wafer.

Figure 11:
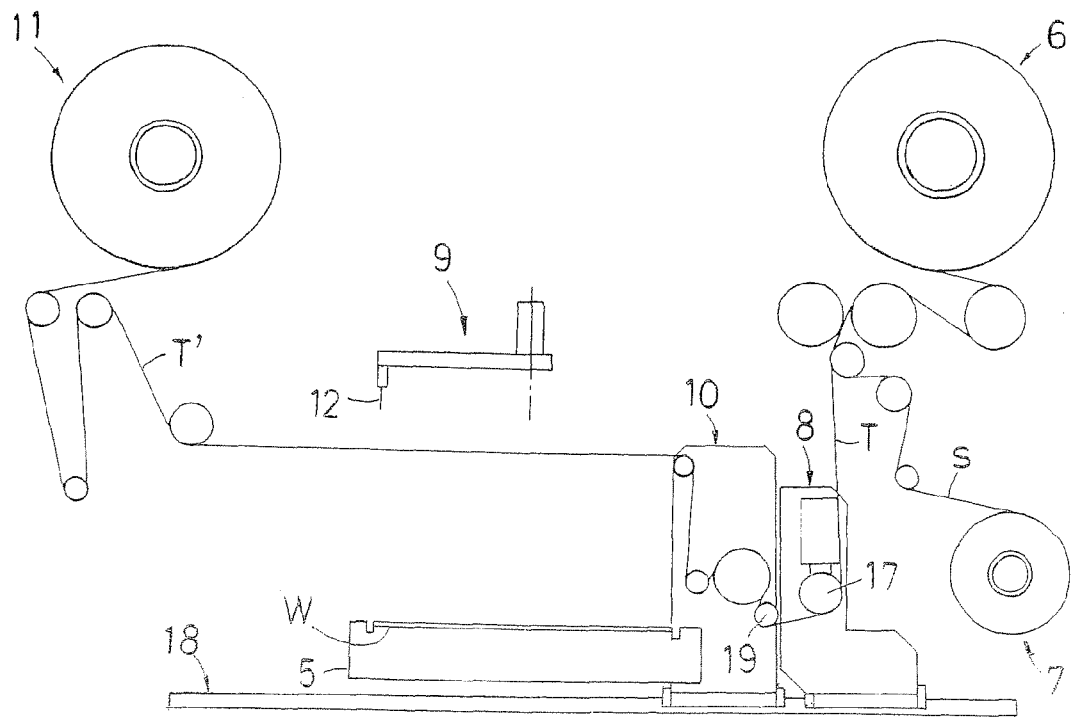

After the tape along the outer periphery of the wafer is cut, the cutter blade 12 is lifted up to the original standby position, as shown in FIG. 11. The separation unit 10 then winds up and separates the unnecessary tape T' after cutting on the wafer W while moving forward.

After the separation unit 10 reaches the end position of the separation operation, the separation unit 10 and the joining unit 8 move in reverse directions, and return to the initial positions. In this case, the unnecessary tape T' is wound up by the collecting bobbin 20, and a constant amount of the protective tape T is fed out from the tape supply part 6.

After the tape joining operation is completed, the suction of the chuck table 5 is released, and the wafer W after the joining process is transferred and placed on the wafer holder 2a of the robot arm 2, and then inserted and collected at the cassette C of the wafer supplying/collecting part 1.

The basic tape joining process of one time is thereby completed, and the above-described operation is thereafter sequentially repeated.

Figure 12:
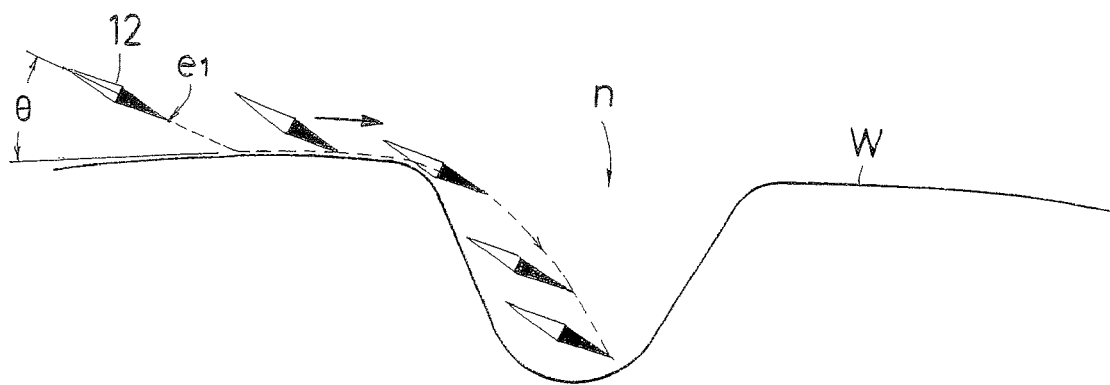
FIG. 12 (*a*) to FIG. 12 (*c*) are plan views of main parts showing the protective tape cutting step at the notch.
Figure 12:
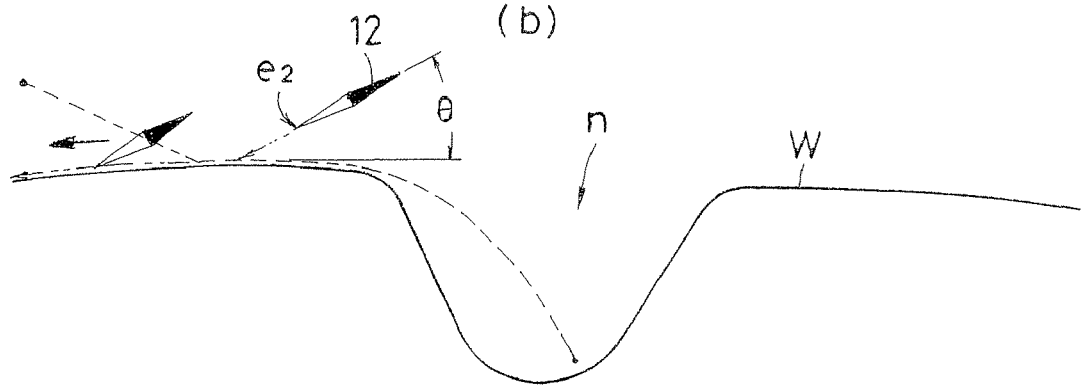
Figure 12:
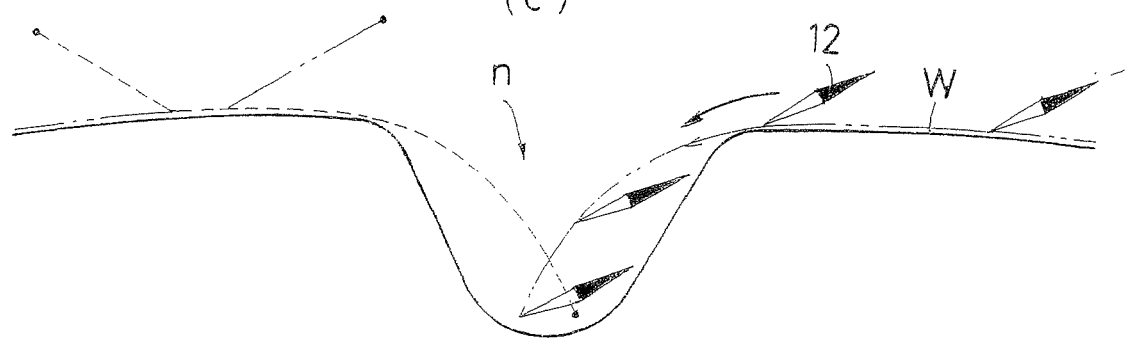
Figure 13:
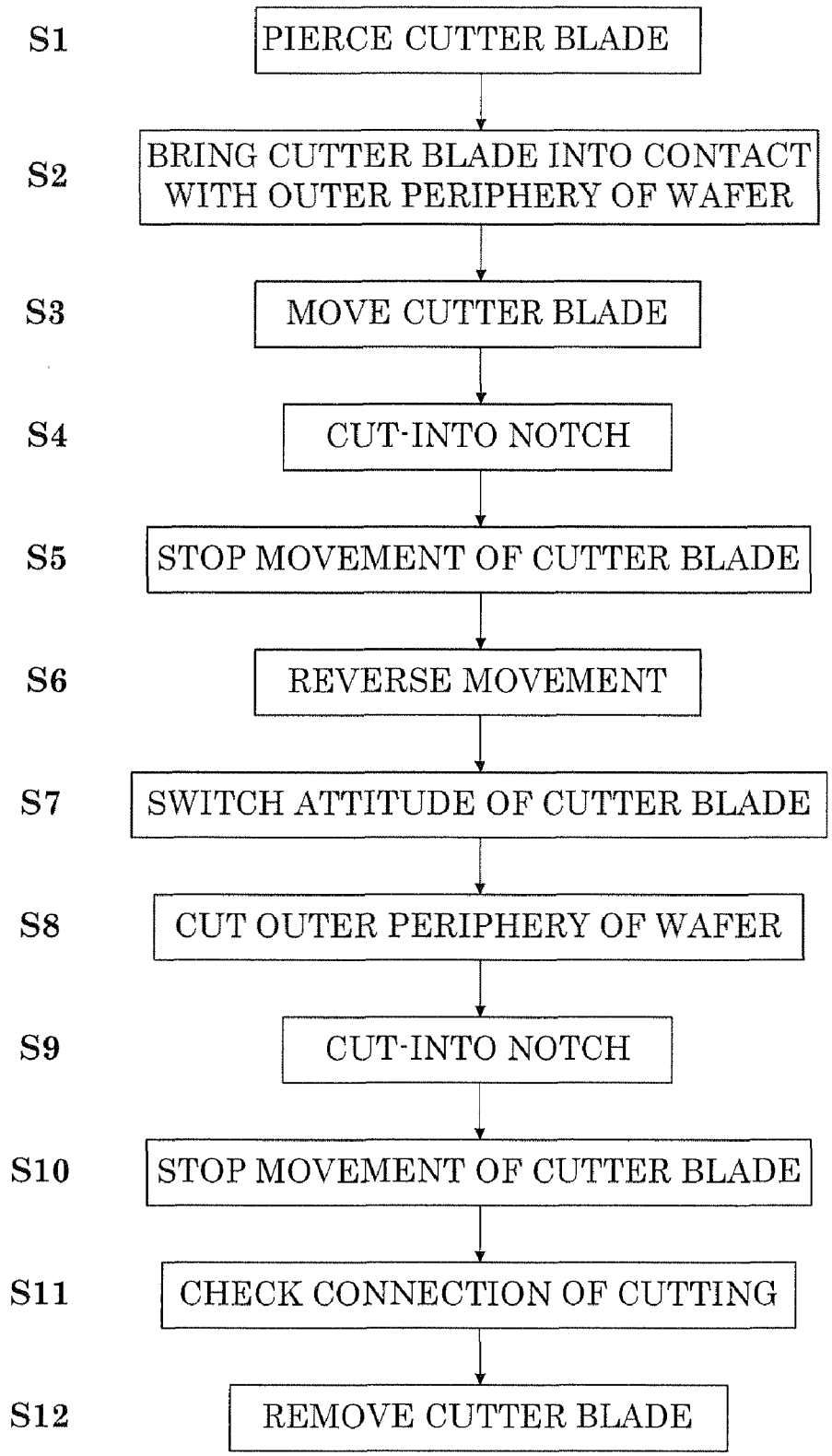
FIG. 13 is a flowchart of the protective tape cutting process.

When the notch is formed for positioning at the outer periphery of the wafer W, the tape cutting process at the notch is performed as below according to the steps shown in the flowchart of FIG. 13. The notch n shown in FIG. 12 is for example formed as a V-shaped cutout having an opening width of 4 to 5 mm in the peripheral direction, and a depth of about 3 mm. The wafer W is positioned and loaded on the chuck table 5 so that the notch n is located at the center of the photographing region of the monitoring camera 50. The positional information on the notch n is acquired from the imaging result.

When the tape cutting command is issued, the cutter blade 12 pierces the protective tape T at a predetermined position slightly deviated in the peripheral direction from the notch n, as shown in FIG. 12(a) (step S1). Here, the angle of the cutter blade 12 is adjusted such that one blade edge e1 is in a cutting operation attitude with a predetermined cut-in angle θ with respect to the rotation movement direction. Therefore, as described above, the projection force of the piston rod 43 is reduced, the bracket 34 is slidably moved by the pushing bias force of the spring 42, and the cutter blade 12 is brought into contact with the outer periphery of the wafer W (step S2).

The supporting arm 22 is then rotated, and accompanied therewith, the cutter blade 12 is moved in a predetermined direction (clockwise direction in FIG. 12) while being in slidable contact with the outer periphery of the wafer, and the protective tape T is cut along the outer periphery of the wafer (step S3).

When the cutter blade 12 reaches the notch, the cutter blade 12 slidably biased towards the vertical axis X by the spring 42 cuts into the protective tape T entering from one open end of the notch n while laying the side surface along the inclined surface at the deep part of the notch (step S4).

Immediately before the blade edge of the cutter blade 12 is brought into contact with the deepest part of the notch n, the projection force of the piston rod 43 is raised until balanced with the pushing bias force of the spring 42, and the rotation of the supporting arm 22 is stopped (step S5).

Subsequently, the motor 27 is reversely rotated so that the supporting arm 22 is driven and rotated in the counterclockwise direction, and the blade edge e2 of the cutter blade 12 passes through the cut outward path and is returned to the initial piercing position (step S6).

When the cutter blade 12 reaches the initial position, the projection force of the piston rod 43 is increased to return the cutter blade 12 to the initial position of the outer stroke end against the spring 42, and the turning of the turning member 31 is controlled by the operation control of the air cylinder 39, as shown in FIG. 12(b). That is, the other blade edge e2 of the cutter blade 12 is switched to the cutting operation attitude in the reverse direction inclined at a predetermined cut-in angle θ with respect to the rotation in the reverse direction of the supporting arm 22 (step S7).

The projection force of the piston rod 43 is then reduced, the cutter blade 12 is moved in the reverse direction (counterclockwise direction in FIG. 12) while being pushed against the outer peripheral edge of the wafer by the slide bias force of the spring 42, and the protective tape T is cut in the reverse direction along the outer shape of the wafer (step S8).

When the cutter blade 12 moving in the reverse direction reaches the notch n, the cutter blade 12 cuts into the protective tape T with the side surface lying along the inclined surface of the notch from the other open end of the notch n by the slide bias force, as shown in FIG. 12(c) (step S9). The protective tape in the notch is completely cut when the tape cut-in portion of the latter part connects with the tape cut-in portion of the first part (step S10). Thereafter, the monitoring camera 50 images to check whether or not the tape cut-in portion of the first part and the tape cut-in portion of the latter part are connected at the deep part of the notch n, i.e., whether or not the protective tape T is cut into the wafer (step S11). In a case where the cut portions of the protective tape T at the deepest part of the notch are connected, the cutter blade 12 is removed from the protective tape T (step S12).

When checked by the monitoring camera 50 that the protective tape along the shape of the notch is completely cut, the rotation movement of the supporting arm 22 is stopped, and the cutter blade 12 is lifted up and returned to the original standby state.

Since the protective tape T are individually cut with the side surface of the cutter blade laying along the side surface of the deep part of the notch n from the open end, as described above, both blade edges e1, e2 of the cutter blade 12 will not be in contact with the inclined surface of the notch at an acute angle, and the blade edges will not cut into the inclined surface of the notch. Therefore, the breakage of the wafer W and the early wear of the cutter blade 12 can be suppressed.

When the pierced part on the protective tape is set on the circumference near the notch n, the contact with the side edge of the notch n in time of piercing can be avoided, and the distal end of the cutter blade 12 can be cuttingly moved smoothly towards the deep part of the notch n.

The present invention is not limited to the above-described embodiment, and the following modifications may be made.

(1) The procedure for cutting into the notch n is not limited to the above procedure, and may be carried out as below.

First, after the cut-in of the cutter blade 12 is stopped in step S5 of the example, the movable table 21 is lifted up, the cutter blade 12 is once removed from the notch n, the attitude of the cutter blade 12 is switched, the cutter blade 12 is again pierced from the previous piercing position, and the protective tape T is cut in the counterclockwise direction.

Specifically, when the cutter blade 12 is removed from the notch n, the projection force of the piston rod 43 is increased to return the cutter blade 12 to the initial position of the outer stroke end against the spring 42. Then the tuning of the turning member 31 is then controlled by the operation control of the air cylinder 39, and the other blade edge e2 of the cutter blade 12 is switched to the cutting operation attitude in the reverse direction inclined at a predetermined cut-in angle θ with respect to the rotation movement in the reverse direction of the supporting arm 22.

The cutter blade 12 in the reverse cutting operation attitude is then pierced to the protective tape near the first cutting start position, the projection force of the piston rod 43 is reduced, and the cutter blade 12 is moved in the reverse direction (counter clockwise direction in FIG. 12) while being pushed against the outer peripheral edge of the wafer by the slide bias force of the spring 42 thereby cutting the protective tape T in the reverse direction along the outer shape of the wafer.

Secondly, substantially the entire length of the outer periphery of the wafer is first cut from the vicinity of the notch n to perform the cut-in of the protective tape T from one end side of the notch n, then the cutter blade 12 is once removed, and lastly the cut-in (latter part cut-in step) of the protective tape T is performed from the other end side of the notch n.

(2) The tape cutting closer to the shape of the notch can be performed by controlling the air cylinder 39 such that the cut-in angle of the protective tape T by the cutter blade 12 in the cut-in process to the notch n becomes greater than the cut-in angle θ at the outer periphery of the wafer.

(3) One-bladed cutter blade 12 is used, the angle adjustment range by the air cylinder 39 is set large, and the cutter blade 12 is configured to be switchable to the attitude of forward-reverse cutting operation. That is, it can be performed on the notch n such that the cut-in operation is performed on the protective tape T from the forward direction and the reverse direction.

(4) In the above-described embodiment, the wafer W may be rotated with respect to the non-rotating cutter blade 12 to cut the protective tape T.

(5) In step S11 of the above-described embodiment, in a case where the connection of the cutting of the notch n cannot be checked after cutting the protective tape T, the cutting process may again be performed only on the portion of the notch n. In this case, one or both of the inclined surfaces may be cut again.

The present invention may be embodied in other specific forms without departing from the spirit or essential attributes thereof and, accordingly, reference should be made to the appended claims, rather than to the foregoing specification, as indicating the scope of the invention.

What is claimed is:

1. A protective tape cutting method for a semiconductor wafer, for relatively moving a cutter blade along an outer periphery of the semiconductor wafer formed with a positioning notch to cut out a protective tape joined to a surface of the semiconductor wafer along an outer shape of the wafer, the method comprising the step of:
   cutting the protective tape at a notch portion of the semiconductor wafer,
   wherein the protective tape is cut while laying a side surface of the cutter blade along an oblique side of the notch towards a deep part of the notch from an open end; and
   wherein the cutting step comprises:
   a first part cut-in step of moving the cutter blade towards the deep part of the notch from one open end of the notch while being moved in a constant direction with respect to the outer periphery of the semiconductor wafer;
   a removing step of removing once from the notch the cutter blade cut-in in the first part cut-in step; and
   a latter part cut-in step of moving the cutter blade, which is once removed from the notch and retreated to an initial piercing position, towards the deep part of the notch from another open end of the notch while being moved in a reverse direction with respect to the outer periphery of the semiconductor wafer.

2. The protective tape cutting method for the semiconductor wafer according, to claim 1, wherein
   the protective tape is cut after positional information on the notch is acquired in advance, and
   a cut state of the deep part of the notch after cutting the protective tape is acquired.

3. The protective tape cuffing method for the semiconductor wafer according to claim 2, wherein the protective tape at the notch portion is cut again in a case where cut sites are not connected at the deep part of the notch in the cut state of the deep pan of the notch acquired after cutting the protective tape.

4. The protective tape cutting method for the semiconductor wafer according to claim 1, wherein the cutter blade is double-edged.

5. A protective tape cutting method for a semiconductor wafer, for relatively moving a cutter blade along an outer periphery of the semiconductor wafer formed with a positioning notch to cut out a protective tape joined to a surface of the semiconductor wafer along an outer shape of the wafer, the method comprising the step of:
   cutting the protective tape at a notch portion of the semiconductor wafer,
   wherein the protective tape i cut while laving a side surface of the cutter blade along an oblique side of the notch towards a deep part of the notch from an open end;
   wherein the cutter blade is double-edged; and
   wherein the cutting step comprises:
   a first part cut-in step of moving the double-edged cutter blade towards the deep part of the notch from one open end of the notch while being moved in one direction with respect to the outer periphery of the semiconductor wafer;
   a retreating step of retreating the cutter blade to a cutting start position along a cut outward path from a front of the deep part of the notch; and
   a latter part cut-in step of changing a cut-in angle of the cutter blade from the initial position, cutting the protective tape by moving the cutter blade in a reverse direction with respect to the outer periphery of the semiconductor wafer, and moving the cutter blade towards the deep part of the notch from another open end of the notch.

6. The protective tape cutting method for the semiconductor wafer according to claim 5, wherein
   the protective tape is cut after positional information on the notch is acquired in advance, and
   a cut state of the deep part of the notch after cutting the protective tape is acquired.

7. The protective tape cutting method for the semiconductor wafer according to claim 6, wherein the protective tape at the notch portion is cut again in a case where cut sites are not connected at the deep part of the notch in the cut state of the deep part of the notch acquired after cutting the protective tape.

* * * * *